United States Patent [19]

Furutani et al.

[11] Patent Number: 4,979,013
[45] Date of Patent: Dec. 18, 1990

[54] SEMICONDUCTOR MEMORY DEVICE

[75] Inventors: Kiyohiro Furutani; Koichiro Mashiko; Kazutami Arimoto, all of Itami, Japan

[73] Assignee: Mitsubishi Denki Kabushiki Kaisha, Tokyo, Japan

[21] Appl. No.: 348,188

[22] Filed: May 8, 1989

Related U.S. Application Data

[63] Continuation of Ser. No. 25,717, Mar. 13, 1987, abandoned.

[30] Foreign Application Priority Data

Mar. 13, 1986 [JP] Japan ................................. 61-56120

[51] Int. Cl.$^5$ ...................... H01L 27/02; H01L 29/06; H01L 29/68; G11C 11/24
[52] U.S. Cl. ........................................ 357/55; 357/42; 357/51; 357/23.6; 357/23.11; 365/149
[58] Field of Search ................... 357/42, 23.7, 23.4, 357/23.6, 23.11, 55; 365/51, 72, 154, 149

[56] References Cited

U.S. PATENT DOCUMENTS

| 4,251,828 | 2/1981 | Sakurai | 357/55 |
| 4,549,196 | 10/1985 | Kub | 357/55 |
| 4,606,011 | 8/1986 | Wada et al. | 365/149 |
| 4,700,328 | 10/1987 | Brughard | 365/51 |
| 4,800,525 | 1/1989 | Shah et al. | 365/72 |
| 4,855,628 | 8/1989 | Jun | 365/154 |

FOREIGN PATENT DOCUMENTS

| 88451 | 9/1983 | European Pat. Off. | 357/23.6 |
| 112670 | 7/1984 | European Pat. Off. | 357/23.6 |
| 154685 | 9/1985 | European Pat. Off. | 357/23.6 |
| A-0169346 | 1/1986 | European Pat. Off. | |
| 87302183 | 1/1986 | European Pat. Off. | |
| 187596 | 7/1986 | European Pat. Off. | 357/23.6 |
| 85CH2252-5 | 9/1987 | European Pat. Off. | |
| A-0234741 | 9/1987 | European Pat. Off. | |
| 55-150267 | 11/1980 | Japan | 357/23.6 |
| 56-105664 | 8/1981 | Japan | 357/23.6 |

OTHER PUBLICATIONS

H. Shichijo et al. "Polysilicon Transistors in VLSI MOS Memories", IEDM 84, pp. 228–231.
IBM Technical Disclosure Bulletin, vol. 27, #12, May 1985, pp. 7051–7052.
Horiguchi et al., "A One Mb DRAM with a Folded Capacitor Cell Structure", *IEEE International Solid State Circuits Conference Digest of Technical Papers*, Coral Gables, pp. 244–245, 335, Feb. 1985.
Sunami, "Cell Sructures for Future DRAM's", *International Electron Devices Meeting*, Washington, D.C., pp. 694–697, Dec. 1–4, 1985.
32nd ISSCC Sec. XVII, 1985 IEEE International Solid State Circuits Conf. Digest of Technical Papers, Coral Gables, FL., FEb. 1985, pp. 244–255; Aoriguchi et al.

Primary Examiner—Rolf Hille
Assistant Examiner—Roy Potter
Attorney, Agent, or Firm—Saidman, Sterne, Kessler & Goldstein

[57] ABSTRACT

A semiconductor memory device having a memory cell array of a folded bit line configuration comprises memory cells, two each of which are formed to share a contact hole and surrounded by an isolation trench, and data charge storage capacitance formed on the entire sidewall of the isolation trench except a part of the isolation trench where an isolation oxide film is formed on the sidewall of the isolation trench. The isolation oxide film separates the two memory cells from each other. One word line passes through a region for one bit memory cell, and two bit lines pass through a region for one bit memory cell.

21 Claims, 5 Drawing Sheets

SEMICONDUCTOR MEMORY DEVICE

This application is a continuation of application Ser. No. 025,717, filed Mar. 13, 1987, abandoned.

BACKGROUND OF THE INVENTION

The present invention relates to a semiconductor memory device, and particularly to an improvement for a higher integration.

An example of a memory cell organization of a highly integrated dynamic semiconductor memory device as proposed in the 1985 IEEE International Solid-State Circuits Conference at FAM 17.4 is shown in FIGS. 1A and 1B. Specifically, FIG. 1A is a plan view. FIG. 1B is a cross sectional view along IB—IB in FIG. 1A. As illustrated, the memory device comprises a p-type semiconductor substrate 1, a field oxide film 2, a first polysilicon layer 3, a capacitor insulating (dielectric) film 4, an n+ diffusion layer 5, a first Al interconnection layer 6 forming bit lines and a second poly-silicon layer 7 forming word lines 9. Although not illustrated as such, the second poly-silicon layer 7 is electrically connected at regular intervals with the second Al interconnection layer 8 to reduce the effective resistance of the word line 9. Contact holes 10 are for electrical connection of the first Al interconnection layer 6 to the n+ diffusion layer 5. Cp represents a data charge storage capacitance formed of the poly-silicon layer 3 and the n+ diffusion layer 5 on the rerespective sides of the capacitor insulating film 4, on the sidewall of an isolation trench. Cf represents a data charge storage capacitor formed of the poly-silicon 3 and the n+ diffusion layer 5 on the respective sides of the capacitor insulating film 4 on the flat part.

By utilizing the sidewall of the isolation trench for forming a data charge storage capacitance Cp, the area for the data charge storage capacitance Cf on the flat part can be reduced. As a result, despite the reduction in the chip area, the operation margin is kept high and the soft error rate is maintained low. With longer periphery of the memory cells, the trench can be made shallower to obtain the same data charge storage capacitance Cp+Cf.

When the memory structure described above is simply combined with the folded-bit line configuration as disclosed in the Japanese Patent Application Layingopen No. 74535/1976, the resultant memory device will have a structure as shown in FIG. 2, which is a cross section along II—II in FIG. 1A.

As illustrated, the first poly-silicon layer 3 must be so patterned (etched) that its edge lies on the bottom of the isolation trench 2. When the isolation trench is made to have the minimum patterning width, etching the polysilicon layer in such a manner that its edge lies in the bottom of the isolation trench is difficult.

Moreover, there are isolation trenches on both sides of the channel region of the transfer gate controlled by the second poly-silicon layer 7 forming the word line. Leak currents flow through the sidewalls of the isolation trenches, so that the transistor cannot be made completely OFF.

SUMMARY OF THE INVENTION

An object of the invention is to provide a highly-integrated dynamic semiconductor memory device of the folded-bit configuration which is free of the need to provide an isolation trench close to the channel regions of the transfer gates, so that the leak current is minimized and the transistor can be made completely OFF.

According to the invention, there is provided a semiconductor memory device, having a memory cell array of a folded bit line configuration, comprising memory cells, two each of which are formed to share a contact hole and surrounded by an isolation trench, data charge storage capacitance means formed on the entire sidewall of the isolation trench except a part of the isolation trench where an isolation oxide film is formed on the sidewall of the isolation trench, the isolation oxide film separating the two memory cells from each other, word lines, one word line passing through a region for one bit memory cell, and bit lines, two bit lines passing through a region for one bit memory cell.

With the structure described above, the memory cells are elongated in the direction of the word line, while its surface area is unchanged. As a result, a margin or a space is created which can be used for forming an isolation oxide film between the transfer gates of the memory cells and the periphery of the memory cells.

Therefore, even where isolation trenches are formed throughout the entirety of the periphery of each memory cell and the data charge storage capacitance is formed throughout the entire sidewalls, the leak current can be restrained at a level of a leak current in a normal LOCOS (local oxidization of silicon). This is because there is the flat isolation oxide film and it is not necessary to etch the first poly-silicon layer in such a manner that the edge of the first poly-silicon layer lies in the bottom of the isolation trench.

DETAILED DESCRIPTION OF THE PREFERRED EMBODIMENTS

Figure 1A:
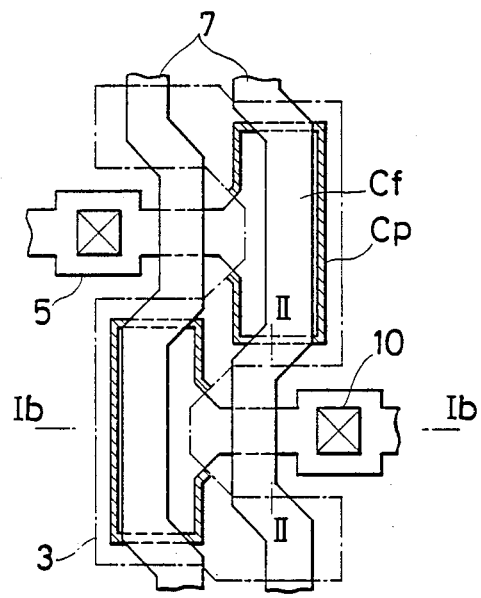
FIG. 1A is a plan view showing part of a conventional highly-integrated dynamic memory device.
Figure 1B:
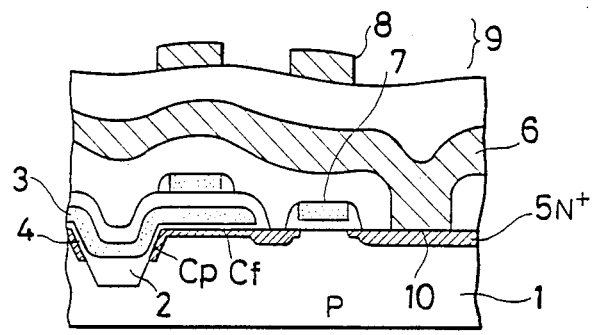
FIG. 1B is a sectional view along line Ib—Ib in FIG. 1A.
Figure 2:
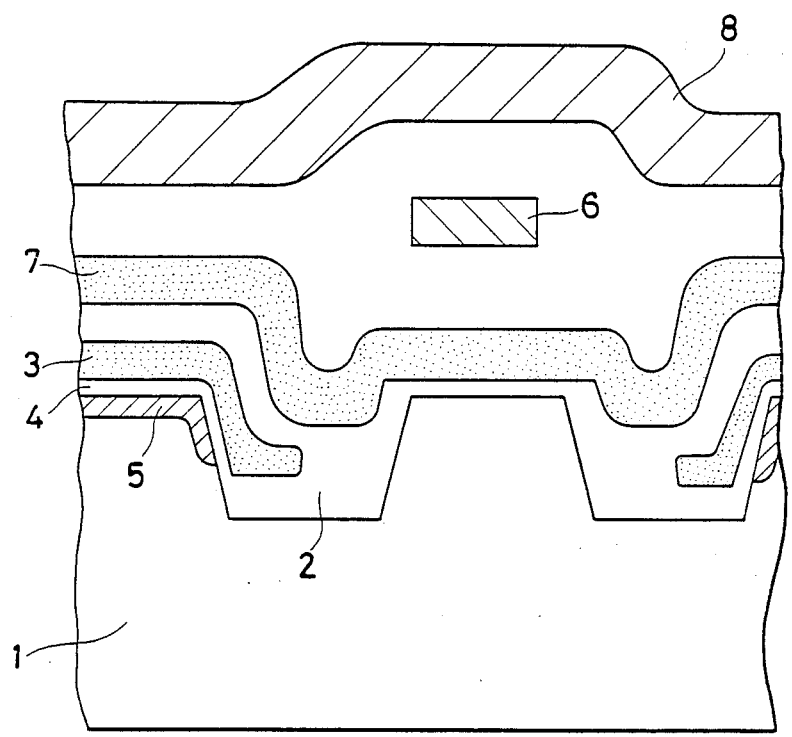
FIG. 2 is a sectional view along line II—II in FIG. 1A showing a memory device which is obtained when the memory structure of FIGS. 1A and 1B and a foldedbit line configuration are combined.

An embodiment of the invention will now be described with reference to FIGS. 3 through 6, which show only part of the entire memory device. As illustrated, the semiconductor memory device of this embodiment comprises memory cells such as those MC11 through MC24 arranged generally in columns and rows to form a matrix and formed on a p-type substrate 1.

In FIGS. 3 to 6, reference numeral 2 denotes an element isolation oxide film formed on the flat part, 2' denotes an element isolation oxide film formed on the sidewall of the isolation trenches 12 which will later be described in further detail. 3 denotes a first poly-silicon layer forming an electrode plate of a data charge storage capacitor 15, 4 denotes a capacitor insulating (dielectric) film, 5 denotes an n+ diffusion layer, 6 denotes a first Al interconnection layer forming bit lines, 7 denotes a second poly-silicon layer forming word lines, 10 denotes contact holes 10 providing electrical connection between the Al interconnection layer 6 and the n+ diffusion layer 5, 11 denotes channels of the transistors controlled by the word lines 7, and 12 denotes isolation trenches. Cp represents the capacitance formed of the poly-silicon layer 3 and the n+ diffusion layer 5 formed on the sidewall of the isolation trench. The capacitance Cp forms part of the data charge storage capacitor 15. Cf represents a capacitance between the poly-silicon layer 3 and the n+ diffusion layer 5 on the flat region. The capacitance Cf also forms part of the data charge storage capacitor 15. Each memory cell comprises a transfer gate and a data charge storage capacitor 15. The transfer gate is formed of a transistor with the channel 11.

The source and the drain of the transistor is formed of the n+ diffusion regions 5. The gate electrode is formed of one of the word lines, e.g., one of 7a through 7d.

Provided under the isolation oxide films 2 on the flat parts and the bottoms of the trenches are p-type impurity-diffused layers 14, similar to that provided for ordinary LOCOS isolation. Similar p-type impurity-diffused layers 14 are also provided under the isolation oxide films 2 on the bottom of the trenches.

The word lines 7a through 7d extend in parallel with each other and in a first direction and pass over the channels 11 of the transistors. The bit lines 6a through 6d extend in parallel with each other and in a second direction orthogonal to the first direction. Each of the alternate bit lines 6a and 6c and the adjacent one of the interleaving bit lines 6b and 6d, e.g., one immediately below said each of the alternate bit lines form a folded bit line pair.

Every two memory cells M11 and M12; M13 and M14; M21 and M22; and M23 and M24 adjacent to each other form a memory cell pair sharing a contact hole 10 for connection with a bit line (one of 6a through 6d).

The memory cell pairs are arranged in lines L1, L2 parallel to the word lines 7a through 7d. The transistors of first ones M11, M13, M21, M23 of the memory cells of the respective memory cell pairs in a memory cell pair line L1 or L2 have their channels 11 positioned under one of the word lines 7a, 7c to be controlled by it. The transistors of second memory cells M12, M14, M22, M24 of the respective memory cell pairs in the same memory cell pair lines L1, L2 have their channels 11 positioned under another word line 7b, 7d adjacent to said one 7a, 7c of the word lines, to be controlled by said another word line 7b, 7d.

The memory cells M11, M12, M21, M22 of the memory cell pairs in alternate memory cell pair lines L1 and the like are connected to alternate bit lines 6a, 6c, and the memory cells M13, M14, M23, M24 of the memory cell pairs in adjacent memory cell pair lines L2 and the like are connected to the intervening bit lines.

The memory cell pair lines L1, L2 adjacent to each other are separated by isolation trenches 12W (part of 12) extending in the direction of the word lines. The memory cell pairs adjacent to each other in the same memory cell pair line L1, L2 are separated from each other by isolation trenches 12B (part of 12), extending in the direction of the bit lines. As a result, each of the memory cell pairs are surrounded by isolation trenches 12W, 12B.

The data charge storage capacitor of each memory cell is formed on the sidewalls of the isolation trenches 12W, 12B surrounding the memory cell pair comprising said each memory cell. The data charge storage capacitor 15 of one of the memory cells of each memory cell pair is separated from the data charge storage capacitor 15 of the other memory cell of the memory cell pair by an isolation oxide film 2' formed on the sidewalls of the isolation trenches 12B. The channel 11 of the transistor of each memory cell is separated from the data charge storage capacitor 15 by an isolation oxide film 2 formed on a flat part of the substrate between the channel 11 and the isolation trench 12B. The data charge storage capacitor 15 comprises a first electrode 5 formed of the n+ diffusion layer 5 on the sidewalls of the isolation trenches, an insulating film 4 formed on the n+ diffusion layer 5 of the isolation trenches, and a second electrode formed of the poly-silicon layer 3 on the insulating film 4.

The bit lines 6a, 6c connected to memory cells MC11, MC12, MC21, MC22 in a memory cell pair line L1 passes over isolation trenches 12B separating adjacent memory cell pairs from each other in an adjacent memory cell line L2. Thus, the memory cell pairs in a memory cell pair line L1 are offset by half a pitch (interval between successive memory cell pairs in the same line) in the direction of the word lines with respect to the memory cell pairs in another memory cell pair line L2 adjacent to said memory cell pair line L1.

Figure 3:
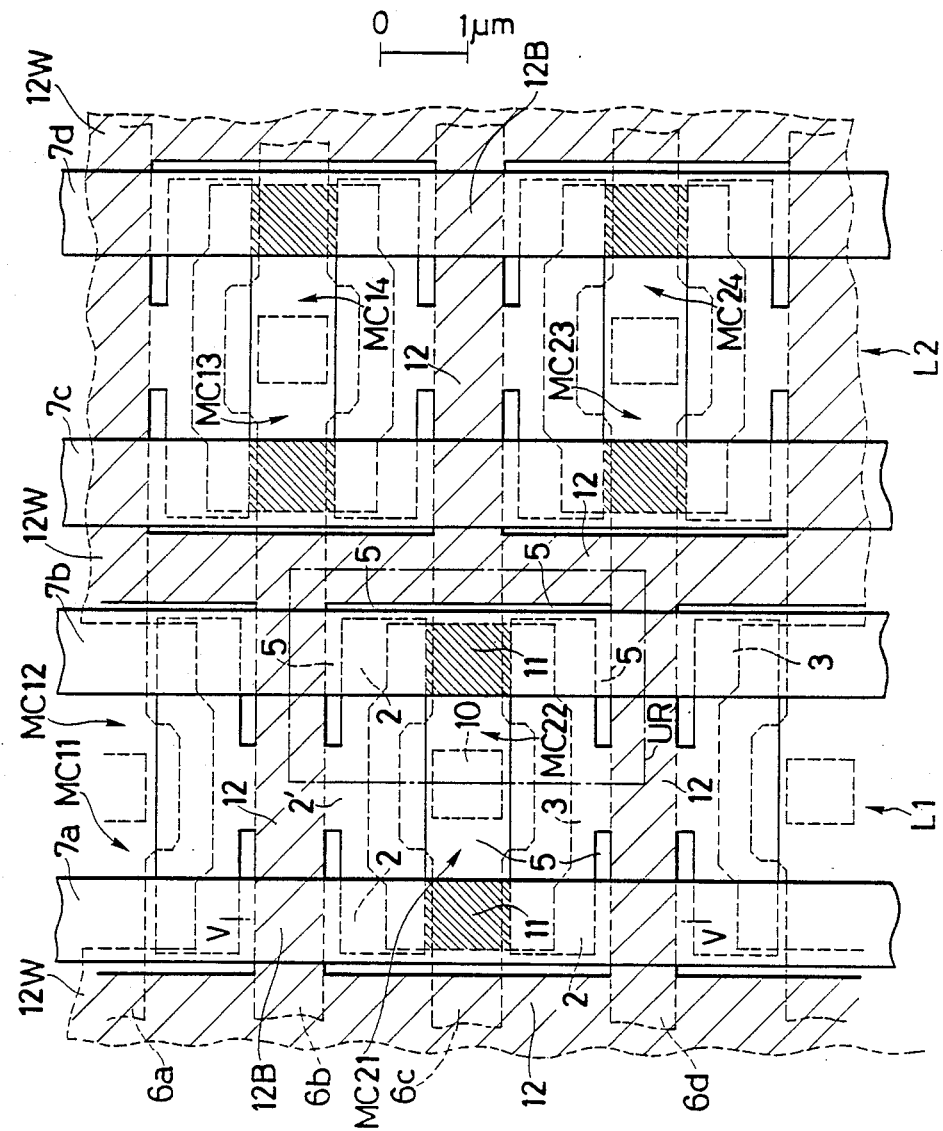
FIG. 3 is a plan view showing part of a highly-integrated dynamic memory device of an embodiment of the invention.
Figure 4:
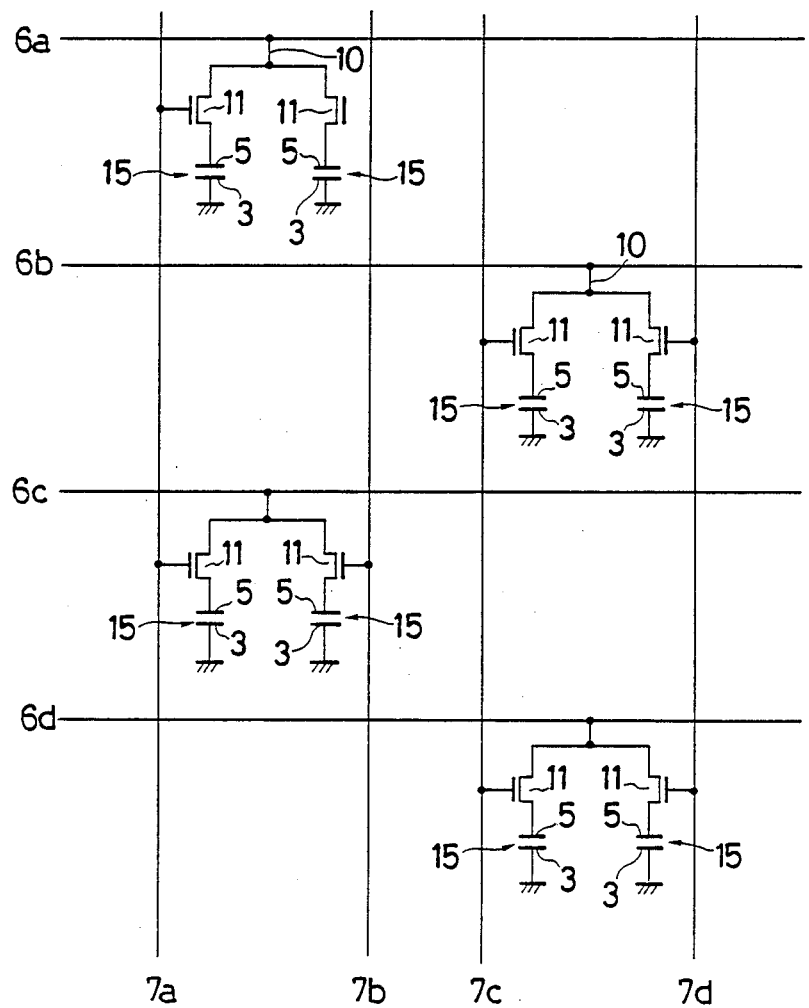
FIG. 4 is a circuit diagram showing electrical connection of the structure of FIG. 3.
Figure 5:
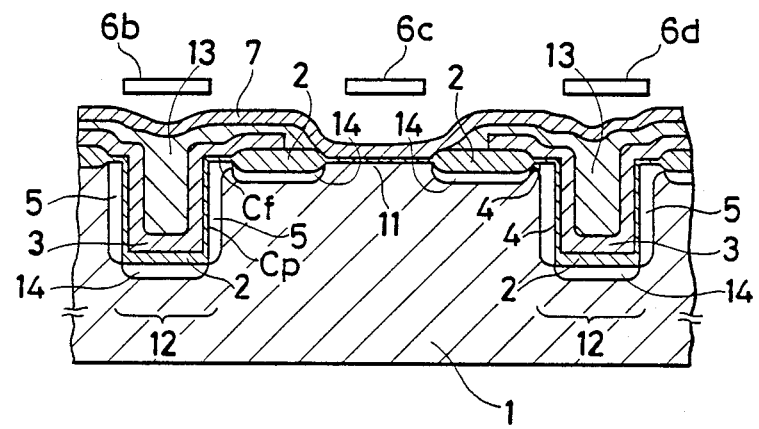
FIG. 5 is a sectional view taken along line V—V in FIG. 3.
Figure 6:
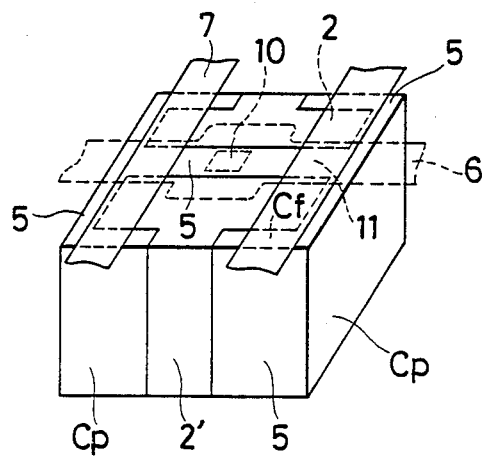
FIG. 6 is a perspective view of an imaginarily cutout portion constituting two memory cells sharing a contact hole.

A region for one bit memory cell comprises one channel 11 and extends, in vertical (as seen in FIG. 3) direction, from the lower half of an Al interconnection 6b to the upper half of an Al interconnection 6d, and, in the horizontal (as seen in FIG. 3) direction, from the center of a contact hole 10 to the center of an isolation trench 12, as indicated by a chain line UR. Two bit lines (one half of 6b, one half of 6d and an entirety of 6c pass through the one bit memory cell region UR, and one word line (the entire width of 7b) passes through the one bit memory cell region UR. Every two bit lines (e.g., 6c and 6d) adjacent to each other are connected (outside the range of FIGS. 3 to 6) to form a folded bit line pair. When a word line, e.g., 7a is at a high potential, the transistors with their channels under the word line 7a are conductive and hence those transistors connect the respective data charge storage capacitors to the respective bit lines such as 6c, while the adjacent bit lines such as 6d are disconnected from the corresponding data charge storage capacitors because the corresponding transistors with their channels under the word lines such as 7c are nonconductive. In other words, when a memory cell connected to a bit line, e.g., 6c is selected, none of memory cells connected to the other bit line of the folded bit line pair, e.g., 6d is selected.

Moreover, with the structure described above, isolation trenches 12 are formed along the entire periphery of the memory cells and data charge storage capacitors can be formed on the sidewalls of the isolation trenches. Because a flat isolation oxide film 2 is provided on both sides of each transfer gate 11, it is not necessary to pattern the first poly-silicon layer 3 to have its edge within the region of the isolation trenches 2. Therefore, the fabrication process is facilitated.

Furthermore, the isolation trenches 12 and the transistor channel regions 11 are not close to each other, so that control of the leak current which is controlled by the word line 7 is facilitated. As a result, the data charge retention characteristics is improved.

The isolation trenches 12 are formed along the entire periphery of the memory cells. The data charge storage capacitors, specifically their electrodes can be formed throughout the entire sidewalls of the isolation trenches Cp, except a portion 2' of the sidewalls for separating from each other the two memory cells sharing the contact hole 10, where an isolation oxide film 2' is formed on the sidewalls. Accordingly, a large capacitance can be obtained even if the trenches are shallow.

As an example, FIG. 3 shows memory cells designed under 0.8 micron design rule. Where the cell area=2.6 microns×4.2 microns=10.92 square microns, the capacitance of 50 fF (1 fF=$10^{-15}$ F) can be obtained, if the thickness of the capacitance insulating film is 100Å and the isolation trenches is 1.94 microns. Thus, the isolation trenches can be shallower than those of the memory cells of 4M bit DRAM which have been proposed and announced.

In the embodiment described, memory cells having a transfer gate with an n-type channel formed on a p-type substrate are described. But the invention is applicable to memory cells having a transfer gate with a p-type channel formed on an n-type substrate.

As has been described, according to the invention, memory cell arrays are in the form of a folded-bit line configuration and the isolation trenches are formed to surround the memory cells and are separated from the transistor channel regions. As a result, it is not necessary to etch the first poly-silicon layer to have its edge in the isolation trenches and the leak current of the transistor can be restrained at a level of the current of ordinary LOCOS. Moreover, a sufficient data charge storage capacitance can be ensured even if the trenches are relatively shallow. The yield rate and the reliability of the memory device can be improved substantially.

What is claimed is:

1. A semiconductor memory device having a memory cell array of a folded bit line configuration, comprising
    a semiconductor substrate, memory cells, two each of which are formed to share a contact hole and surrounded by a trench with an isolation layer at the bottom of the trench,
    said memory cells including a transistor formed in a semiconductor substrate and having a pair of source/drain regions and a channel with two sides, and data charge storage
capacitance means having one electrode formed on the entire sidewall of said trench except a part of said trench where an isolation oxide film is formed on the sidewall of said trench, the isolation oxide film separating the two memory cells from each other,
    word lines, one word line passing through a region for one bit memory cell, and
        bit lines, two bit lines passing through a region for one bit memory cell,
    wherein an isolation oxide film is provided on the two sides of the channel of the transistor.

2. A semiconductor memory device having a memory cell array of a folded bit line configuration, comprising;
    a semiconductor substrate,
    memory cells arranged generally in rows and columns to form a matrix, each memory cell comprising a transfer gate and a data charge storage capacitor, the transfer gate being formed of a transistor formed in said substrate and having a pair of source/drain regions and a channel with two sides,
    word lines extending in parallel with each other and in a first direction, and passing over the channels of the transistors,
    bit lines extending in parallel with each other and in a second direction substantially orthogonal to the first direction, every two bit lines adjacent to each other forming a folded bit line pair,
    every two memory cells adjacent to each other forming a pair of memory cells sharing a contact hole for connection with a bit line,
    the memory cell pair being arranged in lines parallel with the word lines, with the transistors of first memory cells of the respective memory cell pairs in a memory cell pair line having its channel positioned under one of the word lines to be controlled by it, and transistors of second memory cells of the respective memory cell pairs in the same memory cell pair lines having its channel positioned under another word line adjacent to said one of the word lines, to be controlled by said another word line,
    the memory cell pair lines adjacent to each other being separated by trenches with an isolation layer at the bottom of said trench, and memory cell pairs adjacent to each other in the same memory cell pair line being separated from each other by trenches with an isolation layer at the bottom of the trench, so that each of the memory cell pairs are surrounded by trenches with an isolation layer at the bottom of the trench,
    said data charge storage capacitor of each memory cell having electrodes formed on the entirety of the sidewalls of the trench surrounding the memory cell pair except a part of said trench where an isolation oxide film is formed on the sidewall of said trench, the isolation oxide film separating the two memory cells from each other; and
    wherein an isolation oxide film is provided on the two sides of the channel of the transistor.

3. A device according to claim 2, wherein the data charge storage capacitor of one of the memory cells of each memory cell pair is separated from the data charge storage capacitor of the other memory cell of the memory cell pair by an isolation oxide film .

4. A device according to claim 2, wherein the channel of the transistor of each memory cell is separated from the data charge storage capacitor by an isolation oxide film between the channel and said trench.

5. A device according to claim 2, wherein the data charge storage capacitor comprises a first electrode formed of a heavily diffused region on the sidewalls of said trenches, an insulating film formed on the heavily diffused region of said trenches, and a second electrode formed of a poly-silicon layer, on the insulating film.

6. A device according to claim 2, wherein the memory cells of the memory cell pairs in one of the memory cell pair lines are connected to alternate bit lines, and the memory cell pairs in adjacent memory cell pair lines are connected to the interleaving bit lines.

7. A device according to claim 2, wherein a bit line connected to memory cells in a memory cell pair line passes over said trenches separating adjacent memory cell pairs from each other in adjacent memory cell lines.

8. A device according to claim 2, wherein the memory cell pairs in one of the memory cell pair lines are offset with respect to the memory cell pairs in another memory cell pair line adjacent to said one of the memory cell pair lines, by an interval between the successive memory cell pairs in the same cell pair line so that said trenches separating memory cell pairs in the same cell pair line are in alignment with the center, in the direction of the word lines, of the memory cell pairs in the adjacent cell pair line.

9. A device according to claim 2, wherein said trenches separating the adjacent memory cell pairs in the same memory cell pair line extend in the direction of the bit lines.

10. A device according to claim 2, wherein said trenches separating from each other the adjacent memory cell lines extend in the direction of the word lines.

11. A device according to claim 1, wherein pairs of parallel bit lines are provided and each pair of bit lines are connected at one end thereof to a sense amplifier.

12. A device according to claim 11, wherein each of the sense amplifiers comprises a flip-flop circuit having first and second data nodes, and said each pair of the bit lines are connected at one end thereof to said first and second data nodes of the sense amplifier.

13. A device according to claim 1, wherein the isolation oxide film electrically isolate, from each other, said ones of the electrodes of said data charge storage capacitance means of the pair of memory cells sharing a contact hole.

14. A device according to claim 1, wherein the bit lines are connected to one of the source/drain regions of said transistor.

15. A device according to claim 2, wherein each pair of bit lines are connected at one end thereof to a sense amplifier.

16. A device according to claim 15, wherein each of the sense amplifiers comprises a flip-flop circuit having first and second data nodes, and said each pair of the bit lines are connected at one end thereof to said first and said second data nodes of the sense amplifier.

17. A device according to claim 2, wherein the isolation oxide film electrically isolates, from each other, said ones of the electrodes of said data charge storage capacitor of the pair of memory cells sharing a contact hole.

18. A device according to claim 2, wherein the bit lines are connected to one of the source/drain regions of said transistor.

19. A device according to claim 3, wherein the data charge storage capacitor of one of the memory calls of each memory cell pair is separated from the data charge storage capacitor of the other memory cell of the memory cell pair also by an impurity diffused layer formed on the sidewalls of said trenches.

20. A device according to claim 4, wherein the channel of the transistor of each memory cell is separated from the data charge storage capacitor also by an impurity diffused layer formed on a flat part of the substrate between the channel and said trench.

21. A device according to claim 6, wherein the memory cell pairs in one of the memory cell pair lines are offset with respect to the memory cell pairs in another memory cell pair line adjacent to said one of the memory cell pair lines, by half an interval between the successive memory cell pairs in the same cell pair line, so that said trench separating memory cell pairs in the same cell pair line are in alignment with the bit line connected to the memory cell pair in the adjacent cell pair line.

* * * * *